(12) United States Patent
Yano

(10) Patent No.: US 12,033,681 B2
(45) Date of Patent: Jul. 9, 2024

(54) SEMICONDUCTOR STORAGE DEVICE

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 194 days.

(21) Appl. No.: 17/727,834

(22) Filed: Apr. 25, 2022

(65) Prior Publication Data

US 2022/0383919 A1 Dec. 1, 2022

(30) Foreign Application Priority Data

May 27, 2021 (JP) .................................. 2021-088893

(51) Int. Cl.
| | | |
|---|---|---|
| *G11C 11/00* | (2006.01) | |
| *G11C 13/00* | (2006.01) | |
| *G11C 16/04* | (2006.01) | |
| *G11C 16/08* | (2006.01) | |
| *G11C 16/14* | (2006.01) | |

(Continued)

(52) U.S. Cl.
CPC ........ *G11C 11/005* (2013.01); *G11C 13/0026* (2013.01); *G11C 13/0028* (2013.01); *G11C 13/004* (2013.01); *G11C 13/0069* (2013.01); *G11C 16/0466* (2013.01); *G11C 16/08* (2013.01); *G11C 16/14* (2013.01);
(Continued)

(58) Field of Classification Search
CPC .............. G11C 11/005; G11C 13/0026; G11C 13/0028; G11C 13/004; G11C 13/0069; G11C 16/0466; G11C 16/08; G11C 16/14; G11C 16/24; G11C 16/26; G11C 16/0416; G11C 16/10; G11C 16/16; G11C 13/0007; G11C 16/0483; G11C 13/003

See application file for complete search history.

(56) References Cited

U.S. PATENT DOCUMENTS

| | | | |
|---|---|---|---|
| 9,330,773 B2 | 5/2016 | Lim et al. | |
| 2008/0192542 A1* | 8/2008 | Lee .................... | G11C 16/0483 365/185.08 |

(Continued)

FOREIGN PATENT DOCUMENTS

| | | |
|---|---|---|
| CN | 107481756 | 4/2020 |
| JP | 2012038393 | 2/2012 |

(Continued)

OTHER PUBLICATIONS

"Office Action of Taiwan Counterpart Application", issued on Nov. 17, 2022, p. 1-p. 4.

(Continued)

*Primary Examiner* — Hien N Nguyen
(74) *Attorney, Agent, or Firm* — JCIPRNET

(57) ABSTRACT

A semiconductor storage device capable of achieving low power and high integration is provided. A non-volatile semiconductor memory of the disclosure includes a memory cell array. The memory cell array has a NOR array with a NOR flash memory structure and a variable resistance array with a variable resistance memory structure formed on a substrate. An entry gate is formed between the NOR array and the variable resistance array. When the NOR array is accessed, the entry gate separates the variable resistance array from the NOR array.

14 Claims, 7 Drawing Sheets

(51) Int. Cl.
G11C 16/24 (2006.01)
G11C 16/26 (2006.01)
*H10B 43/30* (2023.01)
*H10B 63/00* (2023.01)

(52) U.S. Cl.
CPC .............. G11C 16/24 (2013.01); G11C 16/26 (2013.01); *H10B 43/30* (2023.02); *H10B 63/00* (2023.02)

(56) References Cited

U.S. PATENT DOCUMENTS

| | | | |
|---|---|---|---|
| 2016/0086641 | A1* | 3/2016 | Sakui ................. G11C 16/0483 365/191 |
| 2018/0040377 | A1* | 2/2018 | Sakui ....................... G11C 8/08 |
| 2019/0067412 | A1* | 2/2019 | Tessariol ............. H01L 23/5222 |
| 2020/0251167 | A1 | 8/2020 | Siau et al. |
| 2022/0392535 | A1* | 12/2022 | Sarpatwari ............. G11C 16/24 |
| 2023/0170021 | A1* | 6/2023 | Yano .................. G11C 13/0038 |

FOREIGN PATENT DOCUMENTS

| | | |
|---|---|---|
| TW | 201203524 | 1/2012 |
| TW | 201734751 | 10/2017 |
| TW | 201911057 | 3/2019 |

OTHER PUBLICATIONS

"Office Action of Korea Counterpart Application", issued on Oct. 13, 2023, with partial English translation thereof, pp. 1-7.

* cited by examiner

SEMICONDUCTOR STORAGE DEVICE

CROSS-REFERENCE TO RELATED APPLICATION

This application claims the priority benefit of Japan application serial no. 2021-088893, filed on May 27, 2021. The entirety of the above-mentioned patent application is hereby incorporated by reference herein and made a part of this specification.

BACKGROUND

Technical Field

The disclosure relates to a semiconductor storage device combining a NOR flash memory and a variable resistance memory.

Description of Related Art

A NOR flash memory is a non-volatile memory capable of performing random access to one memory cell disposed between a bit line and a source line.

On the other hand, a variable resistance memory with a variable resistance element is used as a non-volatile memory replacing the NOR flash memory. By applying pulse voltage to the variable resistance element, the variable resistance memory changes the variable resistance element to be in a high resistance state or a low resistance state in a reversible and non-volatile way to store data.

The variable resistance memory, without performing erase operation as the NOR flash memory does, is capable of rewriting data with low voltage. However, since the memory cell size of the variable resistance memory is not as that of the NOR memory cell, an increase in integration may lead to a decrease in cost performance.

SUMMARY

The disclosure provides a semiconductor storage device capable of achieving low power and high integration.

The semiconductor storage device of the disclosure includes a memory cell array. The memory cell array has a first memory cell array with a variable resistance memory structure and a second memory cell array with a NOR flash memory structure formed on the same substrate, and can access the first memory cell array or the second memory cell array.

In an embodiment, multiple global bit lines extending along the row direction of the memory cell array are formed and shared by the first memory cell array and the second memory cell array. A first connection component selectively connecting the global bit lines to the first memory cell array is formed on the boundary between the first memory cell array and the second memory cell array. In an embodiment, the first connection component disconnects the first memory cell array from the global bit lines when accessing the second memory cell array, and connects the first memory cell array to the global bit lines when accessing the first memory cell array. In an embodiment, the second memory cell array includes multiple sectors along its column direction, and each sector includes a second connection component selectively connecting the sector to the global bit line. In an embodiment, the semiconductor storage device further includes a sector selection component selecting the sectors based on address information. The second connection component connects the sectors selected by the sector selection component to the global bit lines and disconnects the sectors not selected from the global bit lines. In an embodiment, the first connection component divides one global bit line into multiple local bit lines with first spacings, and the second connection component divides one global bit line into multiple local bit lines with spacings that are half of the first spacings. In an embodiment, the first connection component includes S transistors connected in parallel between one global bit line and S sacrificial local bit lines, and forms S/2 of the local bit lines by short-circuiting the adjacent sacrificial local bit lines. The second connection component includes S transistors connected in parallel between one of the global bit lines and S of the local bit lines. The transistors of the first connection component and the transistors of the second connection component have the same size. In an embodiment, the semiconductor storage device further includes a word line selection component selecting a word line of the memory cell array, a bit line selection component selecting the global bit line of the memory cell array, and a read/write control component performing read/write to the memory cell selected by the word line selection component and the bit line selection component.

In an embodiment, the first memory cell array is accessed according to a command used for the second memory cell array. In an embodiment, the command used for the second memory cell array is an erase command. In an embodiment, when the first memory cell array is accessed according to the erase command used for the second memory cell array, data of memory cells of the first memory cell array are changed into a specified state. In an embodiment, a first command and a second command are separately inputted to the semiconductor storage device to access the first memory cell array and the second memory cell array, respectively. In an embodiment, an integration of the second memory cell array is higher than an integration of the first memory cell array. In an embodiment, an operation power of the first memory cell array is lower than an operation power of the second memory cell array.

According to the disclosure, the memory cell array includes the first memory cell array with the variable resistance memory structure and the second memory cell array with the NOR flash memory structure, such that high integration and low power of the semiconductor storage device can be achieved.

DESCRIPTION OF THE EMBODIMENTS

The disclosure integrates a memory cell array with a NOR flash memory structure and a memory cell array with a variable resistance memory structure on a common substrate.

Figure 1:
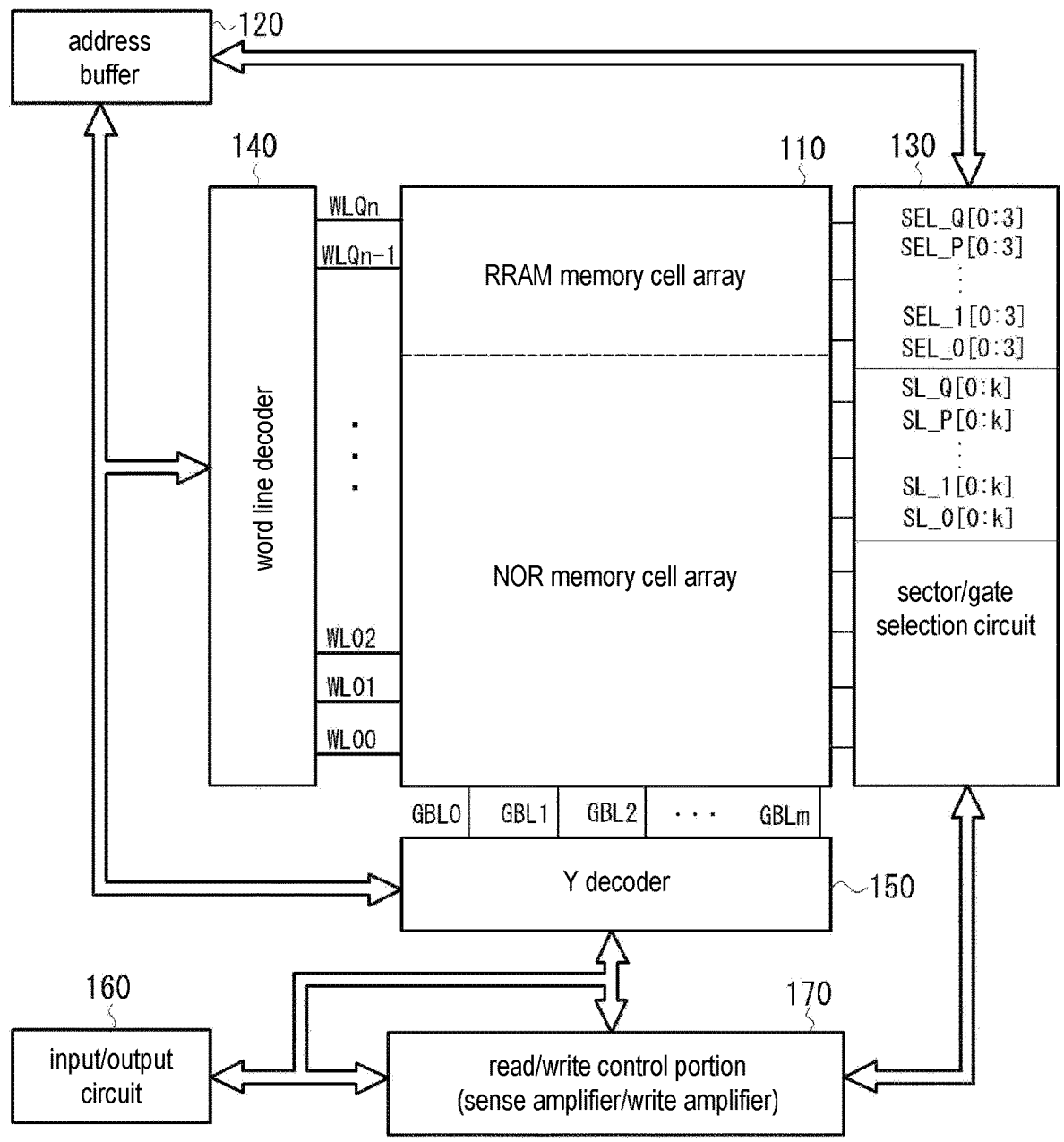
FIG. 1 is a block diagram of the overall structure of a non-volatile memory according to the embodiments of the disclosure.

Next, details of the non-volatile memory of the embodiments of the disclosure are described. FIG. 1 is a block diagram of the overall structure of a non-volatile memory 100 of this embodiment. As shown in this figure, the non-volatile memory 100 includes, for example, a memory cell array 110, an address buffer 120, a sector/gate selection circuit 130, a word line decoder 140, a Y decoder 150, and an input/output circuit 160, and a read/write control portion 170 integrated on a silicon substrate. Each part is connected by an internal bus that can send/receive address, data, control signals, or the like. This figure shows the main structure and omits voltage generation circuits and the like.

The memory cell array 110 includes a first memory cell array (hereinafter referred to as a NOR array) 110A with a NOR flash memory structure and a second memory cell array (hereinafter referred to as a variable resistance array) 110B with a variable resistance memory structure. The NOR array 110A, compared with the variable resistance array 110B, can achieve high integration, while the variable resistance array 110B, compared with the NOR array 110A, can achieve low power operation.

Figure 2A:
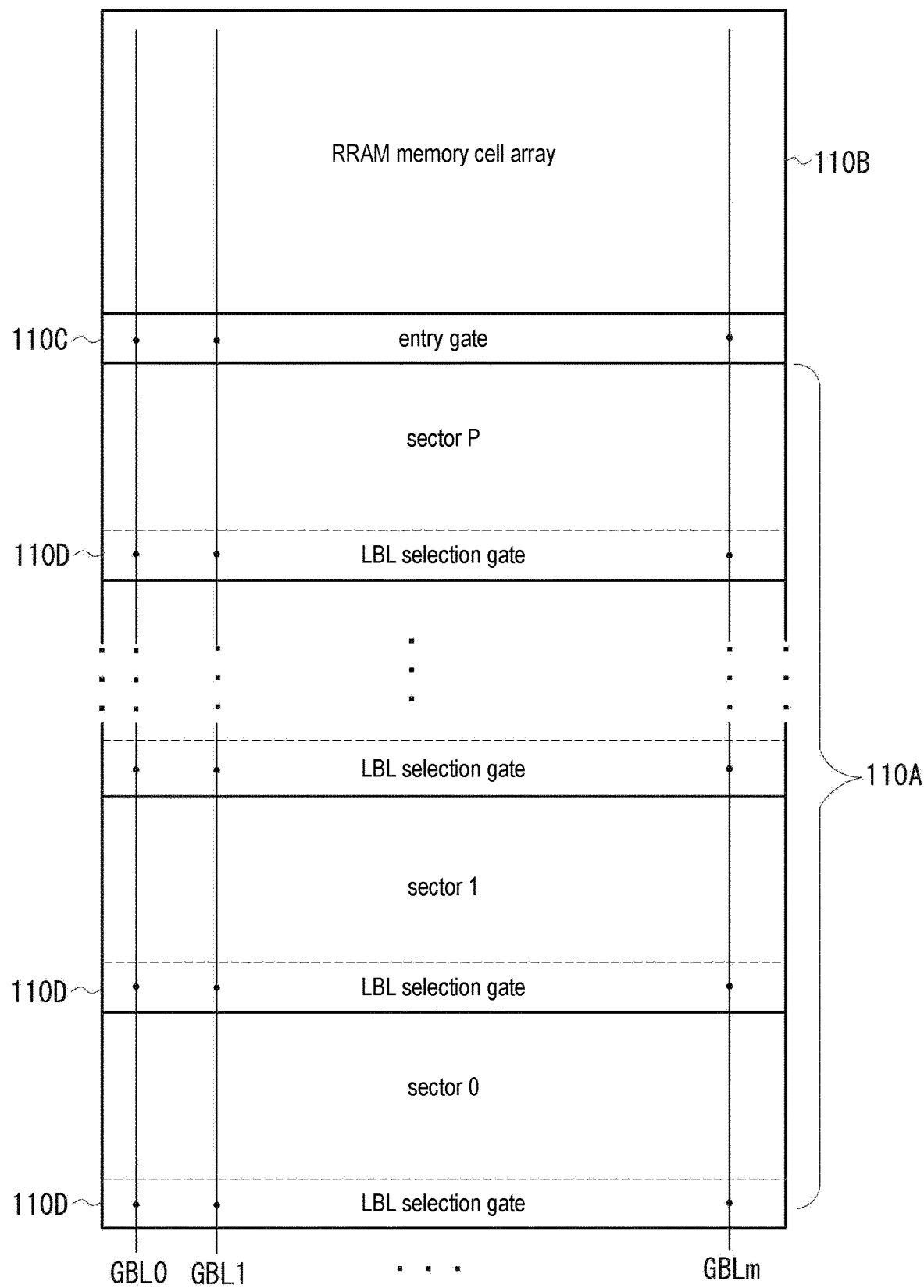
FIG. 2A and FIG. 2B are schematic diagrams of the structure of a memory cell array according to the embodiments of the disclosure.

FIG. 2A is a schematic top diagram of the structure of the memory cell array. The memory cell array 110 includes the NOR array 110A and the variable resistance array 110B along the row direction. The memory size of the NOR array 110A or the variable resistance array 110B is not specifically limited. For example, the memory size of the NOR array 110A is 16 MB, and the memory size of the variable resistance array 110B is 1 Mb.

The NOR array 110A includes multiple sectors (or blocks) 0, 1, . . . P along the row direction, and each sector includes a local bit line (LBL) selection gate 110D for selecting a local bit line extending along the row direction in the sector. An entry gate 110C is formed between the last sector P of the NOR array 110A and the variable resistance array 110B. The entry gate 110C selects the local bit line extending along the row direction in the variable resistance array 110B and separates the variable resistance array 110B from the NOR array 110A when the NOR array 110A is accessed.

Multiple global bit lines GBL0, GBL1, GBL2, . . . GBLm (referred to as global bit lines GBL as a whole) are formed along the row direction of the memory cell array 110. The global bit lines GBL are connected to the LBL selection gate 110D of each sector of the NOR array 110A and the entry gate 110C, which means the global bit lines GBL are shared by the NOR array 110A and the variable resistance array 110B.

Figure 2B:
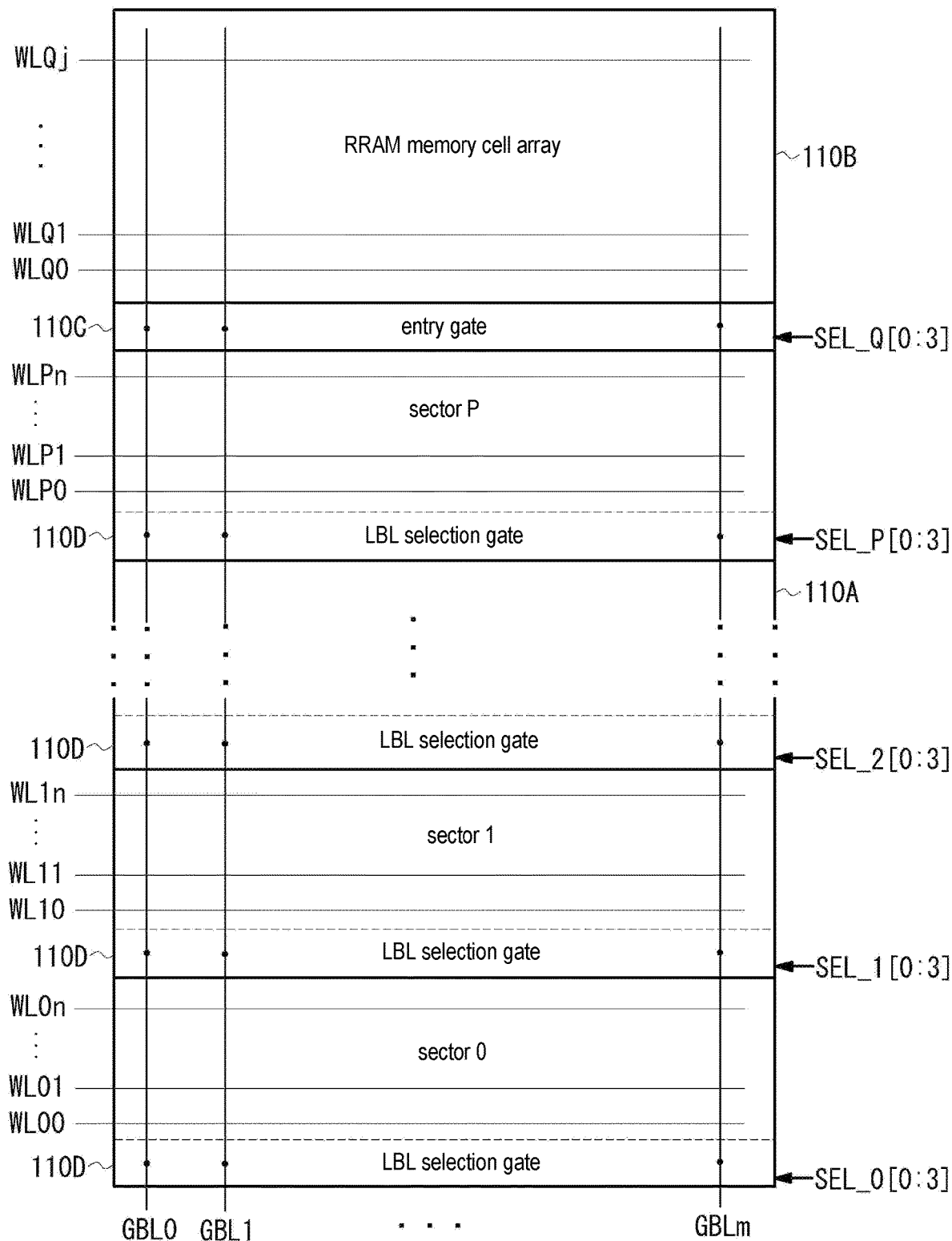

FIG. 2B is a top diagram showing word lines and selection signal lines on the top diagram of FIG. 2A. Multiple word lines are formed along the column direction of the memory cell array 110. Word line WL00 to word line WL0$n$ are formed along the column direction of the sector 0, word line WL10 to word line WL1$n$ are formed along the column direction of the sector 1, and so on. Similarly, word line WLP0 to word line WLPn are formed along the column direction of the sector P, and word line WLQ0 to word line WLQj are formed along the column direction of the variable resistance array 110B.

The LBL selection gate 110D of the sector 0 is supplied with 4-bit selection signal lines SEL_0[0:3] from the sector/gate selection circuit 130, the LBL selection gate 110D of the sector 1 is supplied with selection signal lines SEL_1[0:3], and so on. Similarly, the LBL selection gate 110D of the sector P is supplied with selection signal lines SEL_P[0:3], and the entry gate 110C is supplied with selection signal lines SEL_Q[0:3]. As described later, the sector/gate selection circuit 130 selects a sector of the NOR array 110A or the variable resistance array 110B by a part of the column address (high-order bits), supplies the selection signal lines to the LBL selection gate 110D corresponding to the selected sectors or the variable resistance array 110B, or supplies the selection signal line to the entry gate 110C.

Figure 3:
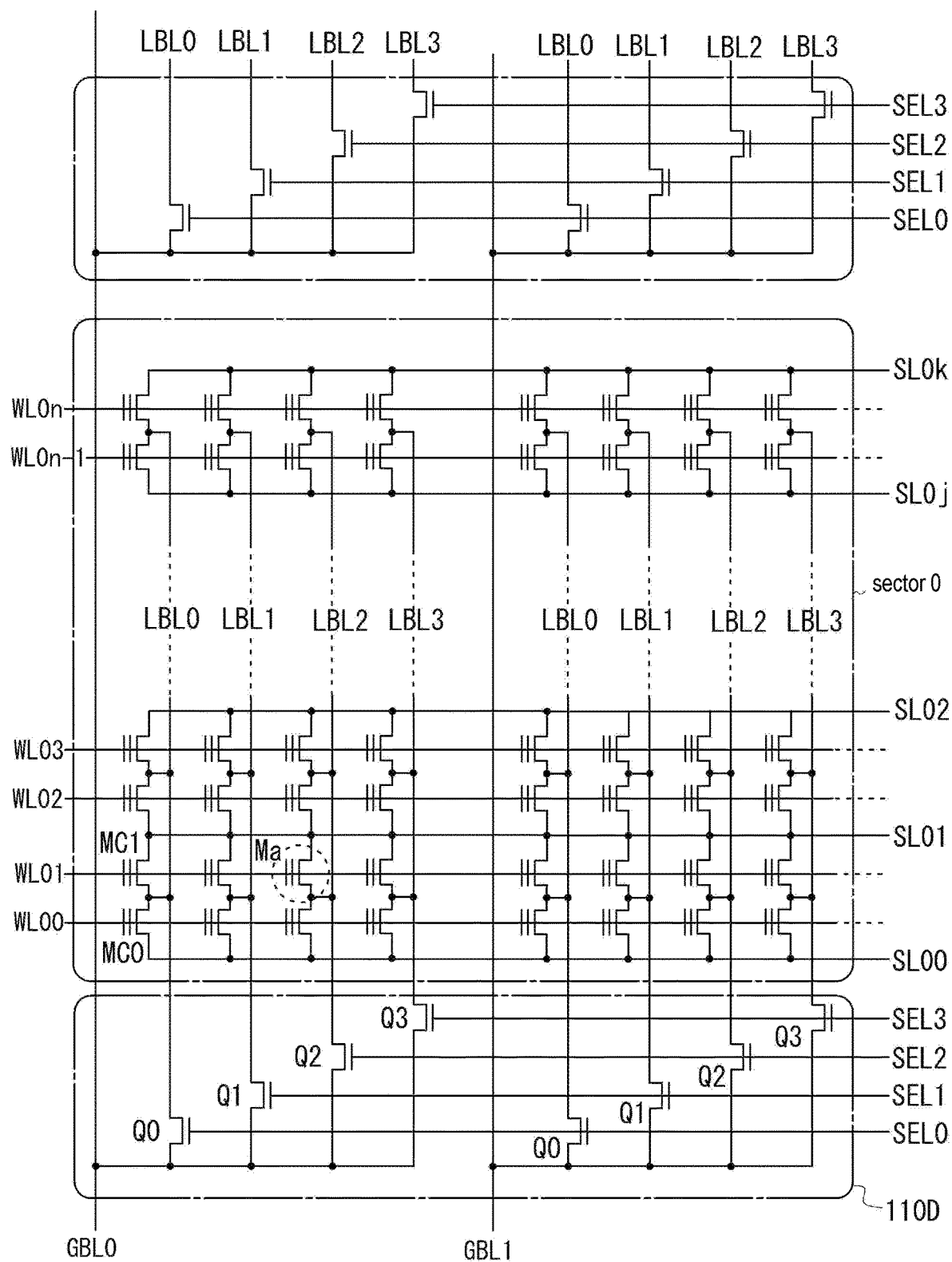
FIG. 3 is a circuit diagram of a part of a NOR memory cell array according to the embodiments of the disclosure.
Figure 4:
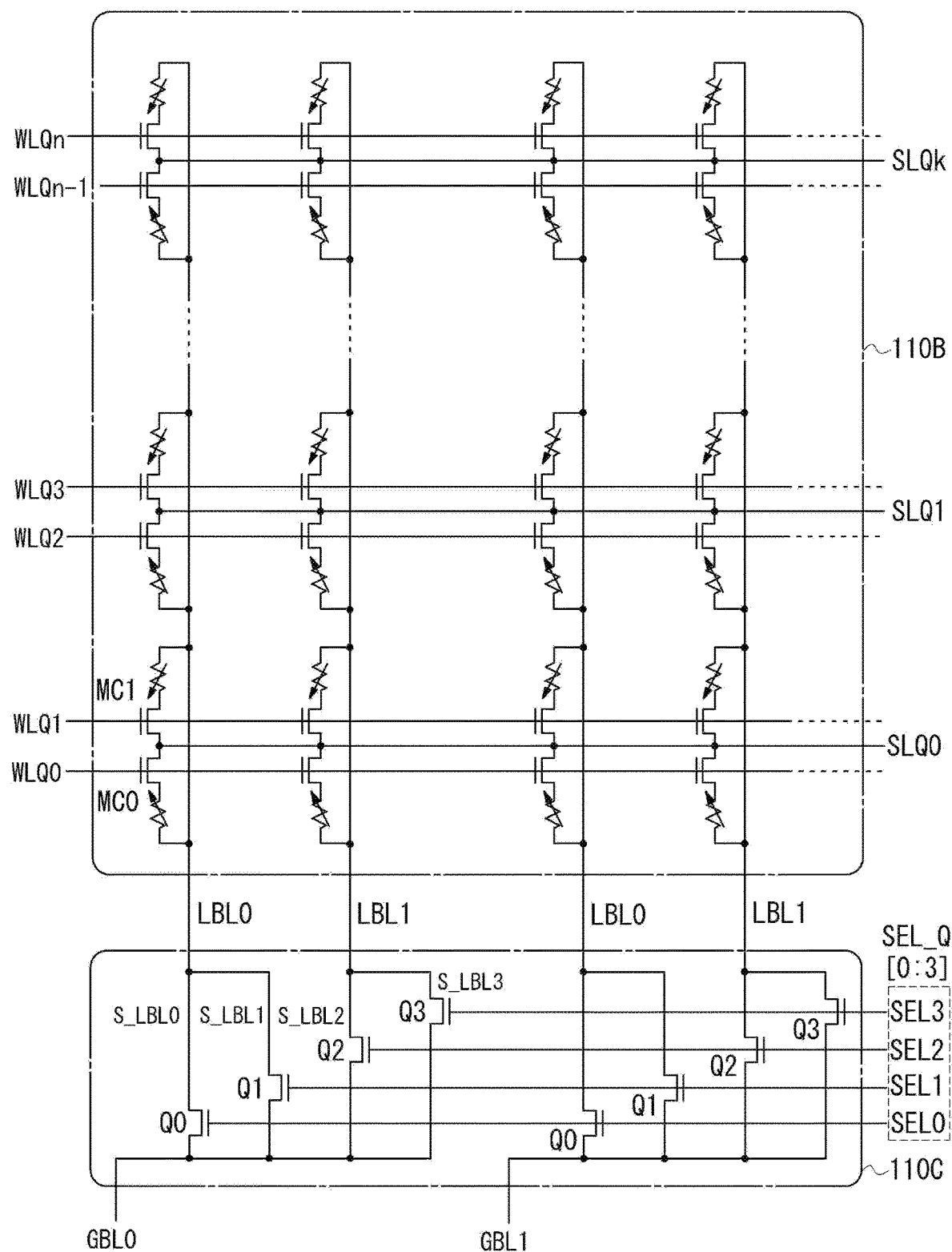
FIG. 4 is a circuit diagram of a part of a variable resistance memory cell array according to the embodiments of the disclosure.

FIG. 3 shows a part of the circuit structure of the sector 0, and FIG. 4 shows a part of the circuit structure of the entry gate 110C and the variable resistance array 110B. As shown in FIG. 3, the LBL selection gate 110D divides one global bit line GBL into four local bit lines LBL0 to LBL3 extending along the column direction. In other words, m global bit lines GBL are divided into m×4 global bit lines by the LBL selection gate 110D.

Four NMOS transistors Q0, Q1, Q2, Q3 connected in parallel are formed between one global bit line GBL and four local bit lines LBL0 to LBL3. Each gate of the transistor Q0 is commonly connected with a selection signal line SEL0 extending along the column direction, each gate of the transistor Q1 is commonly connected with a selection signal line SEL1 extending along the column direction, each gate of the transistor Q2 is commonly connected with a selection signal line SEL2 extending along the column direction, and each gate of the transistor Q3 is commonly connected with a selection signal line SEL3 extending along the column direction.

The sector/gate selection circuit 130 selects a sector according to the high-order bits of the column address, driving any one of the selection signal lines SEL_0[0:3] connected to the LBL selection gate 110D of the selected sector according to the row address as H level and driving the remaining select signal lines to L level. For example, with the selection signal line SEL0 driven to H level and the remaining selection signal lines SEL1 to SEL3 driven to L level, the m transistors Q0 of the LBL selection gate 110D are thus turned on, and the m global bit lines GBL are selectively connected to the corresponding m local bit lines LBL0. On the other hand, the transistors Q1 to Q3 are disconnected, and the local bit lines LBL1 to LBL3 are separated from the global bit lines.

In each sector, multiple memory cells are formed in a matrix. Drain regions of the memory cells adjacent along the row direction are connected together, and the drain regions are connected to the local bit lines. In addition, each gate of the memory cells in the column direction is commonly connected to a word line in the column direction, and each source region of the memory cells in the column direction is commonly connected to a source line in the column direction. For example, the gates of a memory cell MC0 and a memory cell MC1 are connected to the word line WL00 and the word line WL01, the drain region of the memory cell MC0 and the memory cell MC1 is connected to the local bit line LBL0, the source region of the memory cell MC0 is connected to a source line SL00, and the source region of the memory cell MC1 is connected to a source line SL01. The sector/gate selection circuit 130 selects the source line of the sector selected according to the row address and applies operating voltage to the source line selected by the control of the read/write control portion 170.

The memory cell includes, for example, an oxide-nitride-oxide (ONO) film for a charge-trapping accumulation region to function on the surface of a substrate, which includes conductive gates such as polysilicon or metal thereon. Data programming may be performed by trapping hot electrons generated when the current flows through the source/drain regions to the ONO film. However, in addition to this, charges may also be trapped to the ONO film by Fowler-Nordheim (FN) tunneling. The trapped charges may be erased by FN tunneling or hot hole injection.

Figure 5:
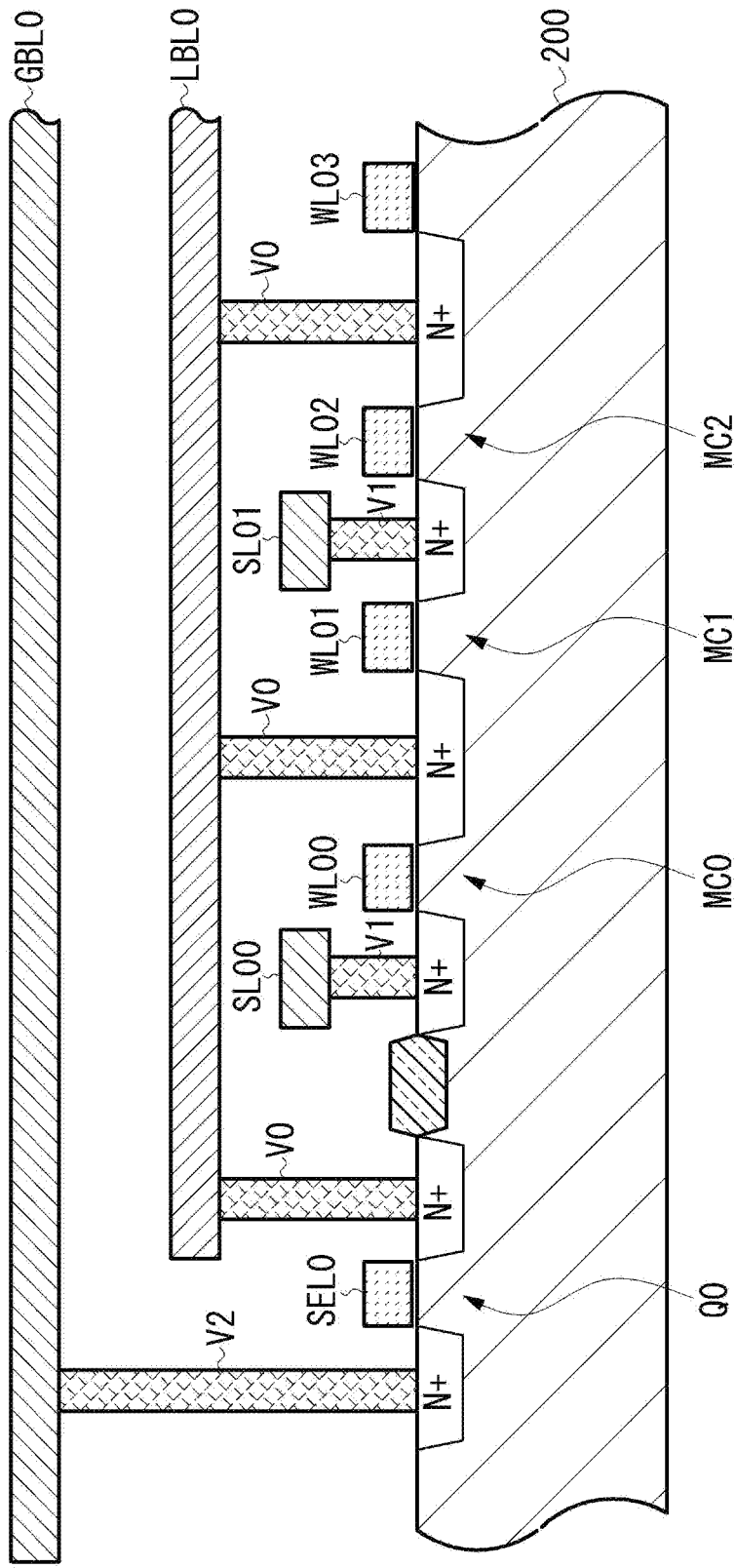
FIG. 5 is a schematic partial cross-sectional diagram of the NOR memory cell array according to the embodiments of the disclosure.

FIG. 5 shows a schematic cross section of the memory cell MC0 and the memory cell MC1 in the row direction. In a P-type silicon substrate or a P-type well region 200, the memory cell MC0 and the memory cell MC1 are formed in an active region formed by a field oxide film or by trench isolation. The gates of the memory cell MC0 and the memory cell MC1 constitute the word line WL00 and the word line WL01 in the column direction. The memory cell MC0 and the memory cell MC1 share the drain region, and the drain region is electrically connected to the local bit line LBL0 in the row direction through a via contact V0. The source regions of the memory cell MC0 and the memory cell MC1 are electrically connected to the source line SL00 and the source line SL01 in the column direction through a via contact V1. In the embodiments, the source line is formed by a conductive layer on a substrate, but the disclosure is not limited thereto. The source line may also be formed by an embedded diffusion region in the substrate. At this time, the source regions of the memory cells in the column direction are connected together.

Furthermore, the transistor Q0 of the LBL selection gate 110D is formed in the active region adjacent to the memory cell MC0. The gate of the transistor Q0 constitutes the select signal line SEL0 in the column direction, the drain region is electrically connected to the global bit line GBL0 in the row direction through a via contact V2, and the source region is electrically connected to the local bit line LBL0 through the via contact V0.

The local bit lines LBL0 to LBL3 formed by the LBL selection gate 110D are connected to the common drain region of the last memory cell WL0n−1 of the sector 0 and the memory cell WL0n and end here. The other sectors 1 to P have the same structure as the sector 0.

Next, the entry gate 110C is described. As shown in FIG. 2A and FIG. 2B, the entry gate 110C is formed on the boundary between the last sector P of the NOR array 110A and the variable resistance array 110B. The entry gate 110C includes transistors Q0 to Q3 of the same gate width and gate length with the transistors Q0 to Q3 of the LBL selection gate 110D, but the entry gate 110C is different from the LBL selection gate 110D in that it is connected to the global bit line GBL by dividing one global bit line GBL into two local bit lines LBL0 and LBL1.

FIG. 4 shows a part of the circuit structure of the entry gate 110C and the variable resistance array 110B. The entry gate 110C includes the transistors Q0 to Q3 connected in parallel between one global bit line GBL and four sacrificial local bit lines S_LBL0 to S_LBL3. The gates of the transistors Q0 to Q3 are connected with the selection signal lines SEL_Q[0:3] from the sector/gate select circuit 130.

The local bit line LBL0 is formed by short-circuiting the sacrificial local bit line S_LBL0 and the sacrificial local bit line S LBL1 adjacent thereto, and the local bit line LBL1 is formed by short-circuiting the sacrificial local bit line S_LBL2 and the sacrificial local bit line S_LBL3 adjacent thereto.

With this structure, the spacing between the local bit line LBL0 and the local bit line LBL1 of the variable resistance array 110B is twice the spacing between the local bit line LBL0 and the local bit line LBL1 and the spacing between the local bit line LBL2 and the local bit line LBL3 of the NOR array 110A. Furthermore, in the entry gate 110C, there are two transistors connected in parallel in one local bit line, such that the current that can be supplied to one local bit line of the variable resistance array 110B becomes twice the current that can be supplied to one local bit that of the NOR array 110A. The spacings between the local bit lines of the variable resistance array 110B are greater than those of the NOR array 110A since the variable resistance memory cell is difficult to be as small in size as the NOR memory cell. Moreover, the current supplied to the local bit line of the variable resistance array 110B is increased since the maximum current flowing through the variable resistance memory cell may reach nearly twice the maximum current flowing through the NOR memory cell (e.g., tunneling hot electron current).

In the variable resistance array 110B, multiple memory cells are formed in a matrix. One memory cell includes one access transistor and one variable resistance element. The gates of the access transistors in the column direction are commonly connected to the word line in the column direction. The source regions of a pair of access transistors adjacent in the row direction are commonly connected to the corresponding source line. One electrode of the variable resistance element is connected to the drain region of the access transistor, and the other electrode of the variable resistance element is connected to the local bit line. For example, the gates of the memory cell MC0 and the memory cell MC1 are connected to the word line WLQ0 and the word line WLQ1, the common source region of the memory cell MC0 and the memory cell MC1 is connected to the source line SLQ0, the drain region of the memory cell MC0 is connected to the local bit line LBL0 through the variable resistance element, and the drain region of the memory cell MC1 is connected to the local bit line LBL0 through the variable resistance element.

The variable resistance element is, for example, a thin-film oxide including transition elements such as hafnium oxide (HfOx), and is set or reset according to the polarity and magnitude of write pulse voltage. For example, the variable resistance element is set to a low resistance state when the current flows from the bit line side to the source line side, and is reset to a high resistance state when the current flows from the source line side to the bit line side.

Figure 6:
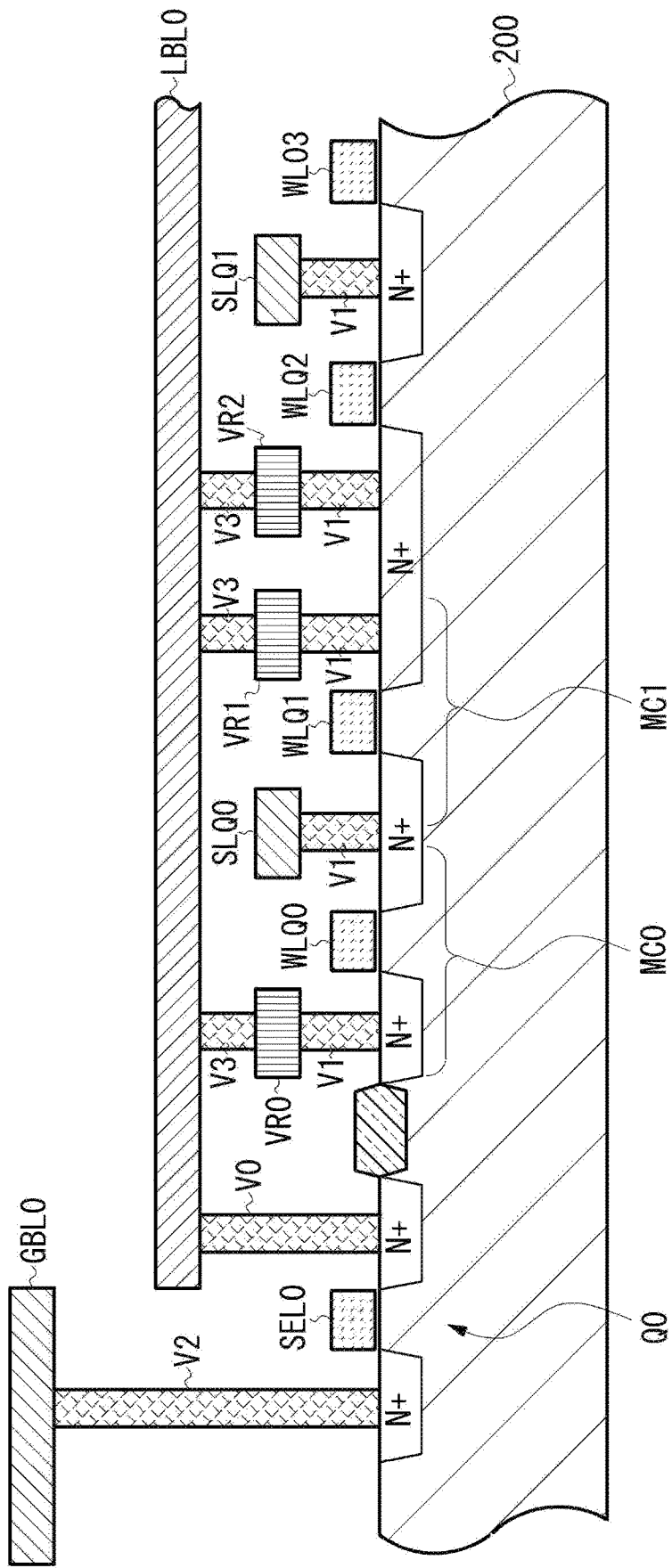
FIG. 6 is a schematic partial cross-sectional diagram of the variable resistance memory cell array according to the embodiments of the disclosure.

FIG. 6 shows a schematic cross section of the memory cell MC0 and the memory cell MC1 in the row direction. In the P-type silicon substrate or the P-type well region 200, the memory cell MC0 and the memory cell MC1 are formed in an active region formed by a field oxide film or by trench isolation. The gates of the access transistors of the memory cell MC0 and the memory cell MC1 constitute the word line WLQ0 and the word line WLQ1 in the column direction, and the common source region of the access transistors is electrically connected to the source line SLQ0 in the column direction through the via contact V1. The drain region of the access transistor of the memory cell MC0 is connected to the variable resistance element VR0 through the via contact V1, and the variable resistance element VR0 is further electrically connected to the local bit line LBL0 in the row direction through a via contact V3. The drain region of the access transistor of the memory cell MC1 is connected to the variable resistance element VR1 through the via contact V1, and the variable resistance element VR1 is further electrically connected to the local bit line LBL0 through the via contact V3.

In the active region adjacent to the memory cell MC0, the transistor Q0 having the entry gate 110C is formed. The gate of transistor Q0 constitutes the selection signal line SEL0 in the column direction, the drain region is electrically connected to the global bit line GBL0 through the via contact V2, and the source region is electrically connected to the local bit line LBL0 through the via contact V0.

The memory cell array 110 is formed by a multi-layer wiring structure, but as shown in FIG. 5 and FIG. 6, it should be understood that the variable resistance array 110B and the entry gate 110C are structures compatible with the NOR array 110A.

With reference to FIG. 1 again, the address buffer 120 receives address from an address bus not shown and provides the received row address and row address to the sector/gate selection circuit 130 and the Y decoder 150. The sector/gate selection circuit 130 selects a sector or the entry gate 110C based on the row address, and drives the selection signal lines SEL0 to SEL3 of the sector or the entry gate 110C selected based on the row address to H level or L level. Furthermore, the sector/gate selection circuit 130 applies operating voltage to the sector selected according to the row address or to the source line of the variable resistance array 110B. The operating voltage is controlled by the read/write control portion 170.

The Y decoder 150 selects the global bit lines GBL0 to GBLm based on the row address. For the selected global bit line GBL, sense voltage, program voltage, erase voltage, and the like are applied according to the control of the read/write control portion 150.

The word line decoder 140 receives the row address from the address buffer 120 and selects the word line WL based on the decoding result of the received row address. For the selected word line, sense voltage, program (write) voltage, erase voltage, and the like are supplied according to the control of the read/write control portion 170. In addition, when all data of the memory cells in the sectors of the NOR array 110A are erased, all the word lines in the sectors are selected.

The input/output circuit 160 outputs data sensed from the memory cell array 110 to an external terminal or writes data received from the external terminal to the memory cells. Furthermore, the address received from the external terminal is provided to the address buffer 120, and a command is provided to the read/write control portion 170.

The read/write control portion 170 includes, for example, a state machine, a microcontroller, a sense amplifier, a write amplifier, and the like that controls the entire operation of the non-volatile memory 100. The read/write control portion 170 interprets the command received from the input/output circuit 160 and performs sense, write, and erase operations based on the interpretation result.

The read/write control portion 170 may also control the read/write operation of the variable resistance array 110B according to the command used for the NOR flash memory. However, in the variable resistance memory, there is no erase operation, so the read/write control portion 170 identifies the situation where the variable resistance array 110B is accessed from the row address, and the variable resistance array 110B performs data rewriting to change all the memory cells into data "1" when receiving an erase command. Of course, a user may also separately input the command used when accessing the NOR array 110A and the command used when accessing the variable resistance array 110B to the non-volatile memory 100.

Next, the operations of the non-volatile memory 100 of this embodiment are described.

[Sense Operation]

When a sense command and address are input from an external terminal, the word line decoder 140 selects a word line according to the row address. The sector/gate selection circuit 130 selects a sector or the entry gate 110C based on the row address, drives the selection signal lines SEL0 to SEL3 of the LBL selection gate 110D of the selected sector or the selection signal lines SEL0 to SEL3 of the entry gate 110C, and selects a source SL according to the row address. The Y decoder 150 selects a global bit line according to the row address. When the sector/gate selection circuit 130 accesses the NOR array 110A, the entry gate 110C is set to non-selection (with all of the selection signal lines SEL0 to SEL3 at L level) to separate the variable resistance array 110B from the NOR array 110A.

For example, when a memory cell Ma shown in FIG. 3 is selected, sense voltage is applied to the selected word line WL01, and GND is supplied to the source line SL01. In addition, the LBL selection gate 110D drives the selection signal line SEL2 to H level to turn on the transistor Q2, the Y decoder 150 selects the global bit line GBL0, and the read/write control portion 170 applies sense voltage to the global bit line GBL0. The memory cell Ma is turned on/off by a threshold value corresponding to the memorized data, and the sense amplifier senses the voltage or current of the global bit line GBL0.

When a memory cell Mb shown in FIG. 4 is selected, the sense voltage is applied to the selected word line WLQ1, the access transistor is turned on, and GND is supplied to the source line SLQ0 selected by the sector/gate selection circuit 130. In addition, the sector/gate selection circuit 130 drives the selection signal line SEL2 of the entry gate 110C to H level and turns on the transistor Q2. The Y decoder 150 selects the global bit line GBL0, and the read/write control portion 170 applies the sense voltage to the global bit line GBL0. According to whether the variable resistance element is in a low resistance state or a high resistance state, the current flowing from the global bit line GBL0 to the source line SLQ0 is different, and the voltage or current is sensed by the sense amplifier.

When writing data "0" into the memory cell Ma of the NOR array 110A, the read/write control portion 170 applies write voltage to the selected word line WL02, applies the write voltage to the selected global bit line GBL0, and applies GND to the selected source line SL01. On the other hand, when writing data "0" into the memory cell Mb of the variable resistance array 110B, the read/write control portion 170 applies the write voltage to the selected word line WLQ2 to turn on the access transistor, applies the write voltage to the selected global bit line GBL0, and applies GND to the selected source line SL01.

When a sector of the NOR array 110A is erased, all word lines in the sector are selected, and GND is applied to the selected word lines. In addition, the sector/gate selection circuit 130 turns off all the transistors Q0 to Q3 of the selected LBL selection gate 110D, and sets the local bit lines LBL0 to LBL3 to a floating state, and applies erase voltage to all the source lines in the selected sector. In this way, high voltage is applied between the gates and the source regions of all the memory cells in the sector, electrons in the memory cells escape to the source side, the threshold value of the memory cells drops, and data becomes "1".

On the other hand, when the address is the variable resistance array 110B, the word line decoder 140 selects all the word lines in the variable resistance array 110B and turns on all the access transistors. The entry gate 110C turns on all the transistors Q0 to Q3 and connects all the local bit lines LBL0 and the local bit lines LBL1 to the global bit lines GBL. The read/write control portion 170 applies GND to the global bit lines GBL in order to write data "1" into all the variable resistance elements, and the sector/gate selection circuit 130 applies the write voltage to the source lines SLQ1 to SLQk.

In this way, according to this embodiment, when the NOR array 110A and the variable resistance array 110B are integrated on the memory cell array 110, the entry gate 110C is disposed on the boundary between the NOR array 110A and the variable resistance array 110B, thereby avoiding the variable resistance array 110B from being affected due to the stress caused by undesired voltage through the global bit lines GBL or the like during the operation of the NOR array 110A.

Furthermore, with the NOR array 110A and the variable resistance array 110B, the advantages of high integration of the NOR array 110A and low power operation of the variable resistance array 110B can be combined.

In the embodiments, the LBL selection gate 110D divides one global bit line into four local bit lines, but this only serves as an example. The number of local bit lines divided from one global bit line may be any number. Moreover, the spacings between the local bit lines divided by the entry gate 110C is set to be twice the spacings between the local bit lines divided by the LBL selection gate 110D, but this only serves as an example. The spacings between the local bit lines divided by the entry gate 110C are only required to be greater than the spacings between the local bit lines divided by the LBL selection gate 110D. Furthermore, the transistors of the entry gate 110C and the transistors of the LBL selection gate have the same size, but this only serves as an example. The transistors of the entry gate 110C may have a gate width greater than that of the transistors of the LBL selection gate 110D.

The embodiments of the disclosure have been described in detail above, but the disclosure is not limited thereto, and various modifications and changes may be made without departing from the scope of the disclosure.

What is claimed is:

1. A semiconductor storage device, comprising:
a memory cell array, having a first memory cell array with a variable resistance memory structure and a second memory cell array with a NOR flash memory structure formed on a same substrate, and being capable of accessing the first memory cell array or the second memory cell array, wherein
a plurality of global bit lines are formed and extend along a row direction of the memory cell array, and the global bit lines are shared by the first memory cell array and the second memory cell array; and
a first connection component selectively connecting the global bit lines to the first memory cell array is formed on a boundary between the first memory cell array and the second memory cell array.

2. The semiconductor storage device according to claim 1, wherein
the first connection component separates the first memory cell array from the global bit lines when accessing the second memory cell array and connects the first memory cell array to the global bit lines when accessing the first memory cell array.

3. The semiconductor storage device according to claim 2, wherein
the second memory cell array comprises a plurality of sectors along a row direction, and each of the sectors comprises a second connection component selectively connecting the sectors to the global bit lines.

4. The semiconductor storage device according to claim 3, wherein
the semiconductor storage device further comprises a sector selection component selecting the sectors based on address information; and
the second connection component connects the sectors selected by the sector selection component to the global bit lines and disconnects the sectors that are not selected from the global bit lines.

5. The semiconductor storage device according to claim 3, wherein
the first connection component divides one of the global bit lines into a plurality of local bit lines with first spacings, and the second connection component divides one of the global bit lines into a plurality of local bit lines with spacings that are half of the first spacings.

6. The semiconductor storage device according to claim 5, wherein
the first connection component comprises S transistors connected in parallel between one of the global bit lines and S sacrificial local bit lines, and the sacrificial local bit lines that are adjacent are short-circuited to form S/2 of the local bit lines;
the second connection component comprises S transistors connected in parallel between one of the global bit lines and S of the local bit lines; and
the transistor of the first connection component has a same size as the transistor of the second connection component.

7. The semiconductor storage device according to claim 2, further comprising:
a word line selection component, selecting a word line of the memory cell array;
a bit line selection component, selecting the global bit lines of the memory cell array; and
a read/write control component, performing read/write to a memory cell selected by the word line selection component and the bit line selection component.

8. The semiconductor storage device according to claim 1, wherein
the first memory cell array is accessed according to a command used for the second memory cell array.

9. The semiconductor storage device according to claim 1, wherein
the read/write operation of the first memory cell array is controlled according to a command used for the second memory cell array.

10. The semiconductor storage device according to claim 8, wherein
the command used for the second memory cell array is an erase command.

11. The semiconductor storage device according to claim 10, wherein
when the first memory cell array is accessed according to the erase command used for the second memory cell array, data of memory cells of the first memory cell array are changed into a specified state.

12. The semiconductor storage device according to claim 1, wherein
a first command and a second command are separately inputted to the semiconductor storage device to access the first memory cell array and the second memory cell array, respectively.

13. The semiconductor storage device according to claim 1, wherein
an integration of the second memory cell array is higher than an integration of the first memory cell array.

14. The semiconductor storage device according to claim 1, wherein
an operation power of the first memory cell array is lower than an operation power of the second memory cell array.

* * * * *